United States Patent
Shin (10) Patent No.: US 7,410,823 B2
(45) Date of Patent: Aug. 12, 2008

(54) IMAGE SENSORS FOR REDUCING DARK CURRENT AND METHODS OF MANUFACTURING THE SAME

(75) Inventor: Jongcheol Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/707,897

(22) Filed: Feb. 20, 2007

(65) Prior Publication Data

US 2007/0207599 A1 Sep. 6, 2007

Related U.S. Application Data

(62) Division of application No. 11/032,147, filed on Jan. 11, 2005, now Pat. No. 7,214,974.

(30) Foreign Application Priority Data

Jun. 4, 2004 (KR) ............ 10-2004-0040900
Nov. 8, 2004 (KR) ............ 10-2004-0090444

(51) Int. Cl.
*H01L 21/00* (2006.01)
(52) U.S. Cl. ............ 438/60; 438/75
(58) Field of Classification Search ............ 438/60, 438/75
See application file for complete search history.

(56) References Cited

U.S. PATENT DOCUMENTS

| | | | |
|---|---|---|---|
| 5,514,887 A | 5/1996 | Hokari | |
| 5,625,210 A | 4/1997 | Lee et al. | |
| 5,904,493 A | 5/1999 | Lee et al. | |
| 6,027,955 A | 2/2000 | Lee et al. | |
| 6,100,551 A | 8/2000 | Lee et al. | |
| 6,504,193 B1 | 1/2003 | Ishiwata et al. | |
| 6,677,656 B2 | 1/2004 | Francois | |
| 6,690,423 B1 | 2/2004 | Nakamura et al. | |
| 6,730,899 B1 | 5/2004 | Stevens et al. | |
| 7,057,219 B2 | 6/2006 | Park et al. | |
| 7,214,974 B2 * | 5/2007 | Shin | 257/225 |

(Continued)

FOREIGN PATENT DOCUMENTS

JP 11-274450 10/1999

(Continued)

OTHER PUBLICATIONS

English language translation of Japanese patent publication 2003-188367 to Ishiwatari et al., Oct. 2007.*

*Primary Examiner*—Mark Prenty
(74) *Attorney, Agent, or Firm*—Volentine & Whitt, PLLC (57) ABSTRACT

An image sensor includes a substrate region of a first conductivity type, a photodiode region of a second conductivity type located in the substrate, a hole accumulated device (HAD) region of the first conductivity type located at a surface of the substrate and over the photodiode region, and a transfer gate located over the surface of the substrate adjacent the HAD region. The image sensor further includes a first channel region of the first conductivity type located in the substrate and aligned below the transfer gate, a second channel region of the second conductivity type located in the substrate between said transfer gate and the first channel region, and an floating diffusion region which is located in the substrate and which electrically contacts the second channel region.

6 Claims, 11 Drawing Sheets

U.S. PATENT DOCUMENTS

| | | |
|---|---|---|
| 7,271,430 B2 * | 9/2007 | Park et al. .................. 257/225 |
| 2005/0280046 A1 | 12/2005 | Shin |
| 2005/0280054 A1 | 12/2005 | Park et al. |

FOREIGN PATENT DOCUMENTS

| | | |
|---|---|---|
| JP | 2003-188367 | 7/2003 |
| JP | 2004-087963 | 3/2004 |
| KR | 1020020057250 A | 7/2002 |
| KR | 2003-0090871 | 12/2003 |

* cited by examiner

IMAGE SENSORS FOR REDUCING DARK CURRENT AND METHODS OF MANUFACTURING THE SAME

CROSS-REFERENCE TO RELATED APPLICATIONS

This is a divisional of application Ser. No. 11/032,147, filed Jan. 11, 2005, and now U.S. Pat. No. 7,214,974, which is incorporation herein by reference in its entirety.

BACKGROUND OF THE INVENTION

1. Field of the Invention

The present invention generally relates to image sensors. More particularly, the present invention relates to image sensors configured to reduce dark current and to methods of manufacturing images sensors to reduce dark current.

2. Description of the Related Art

Figure 1:
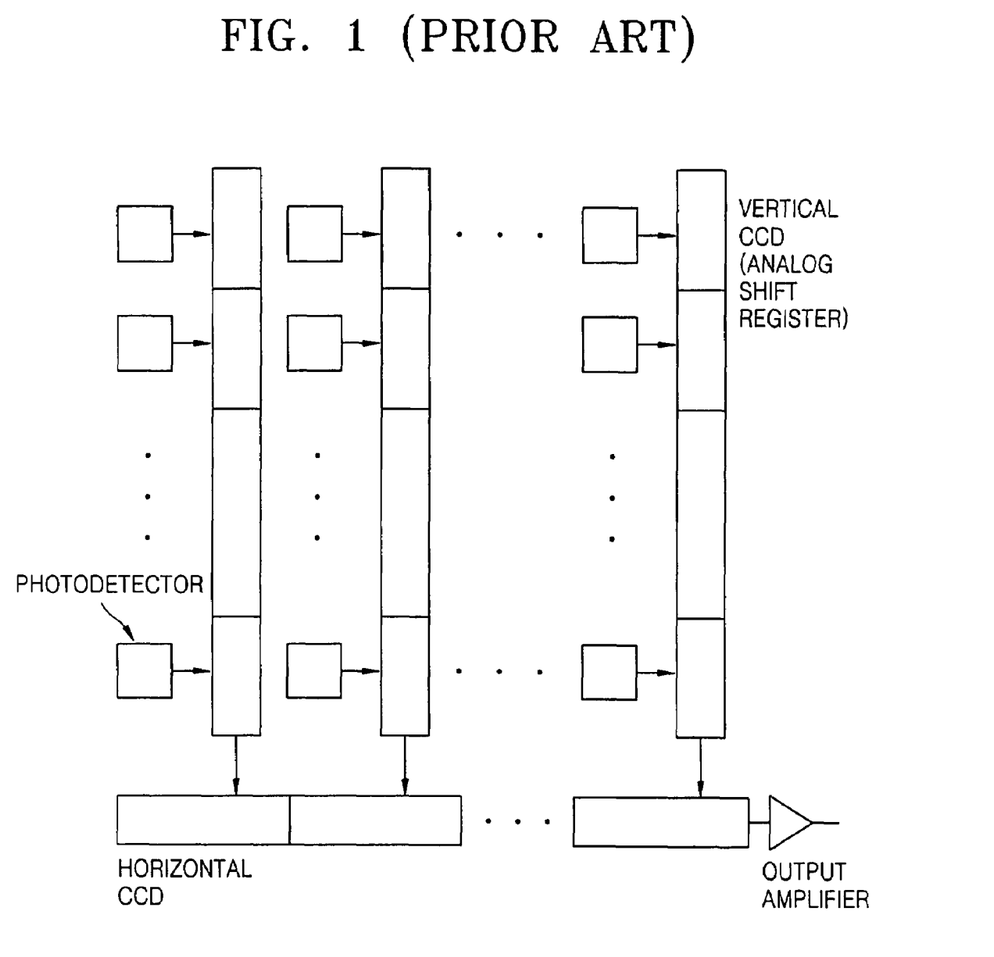
FIG. 1 is a schematic block diagram of an Coupled Device (CCD) image sensor.
Figure 2:
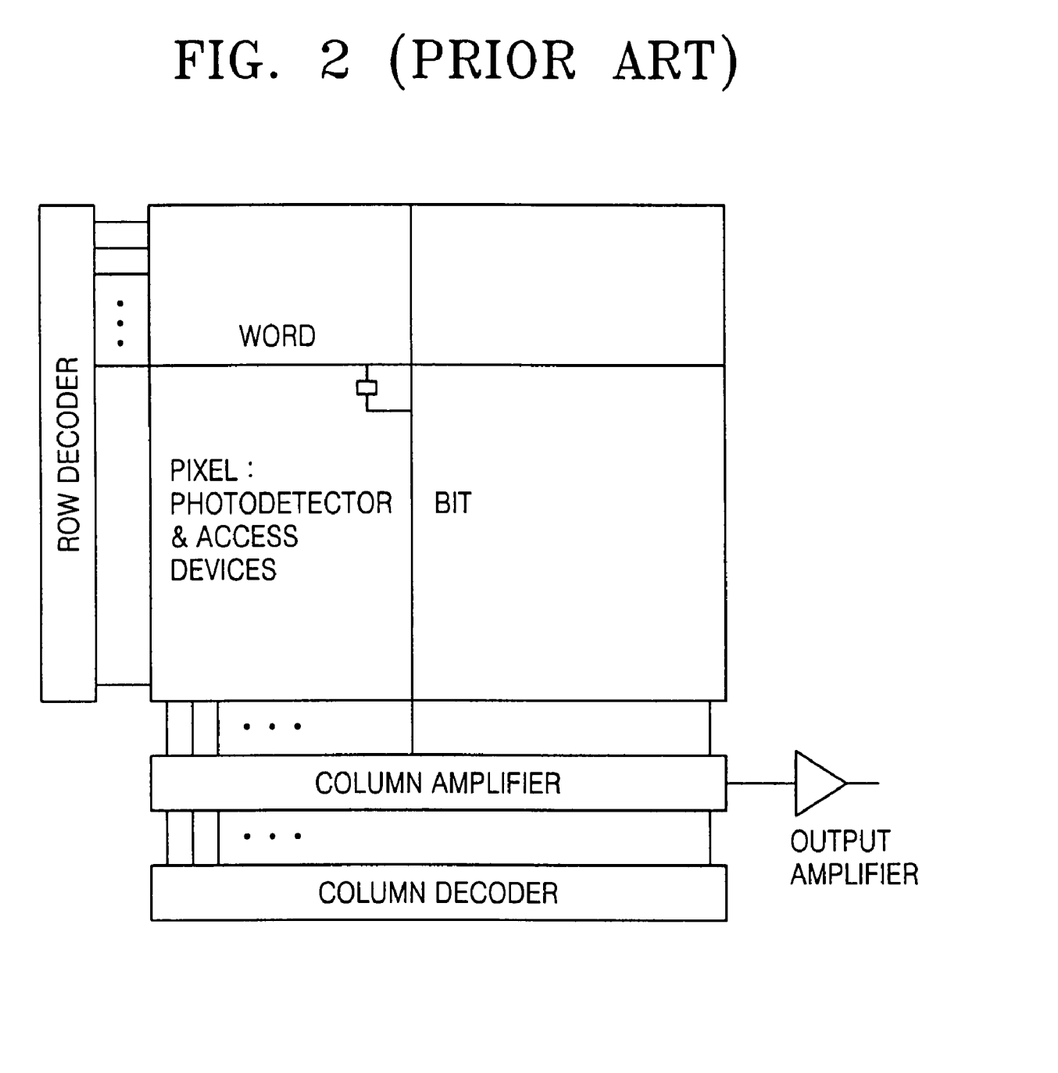
FIG. 2 is a schematic block diagram of a Complimentary Metal Oxide Semiconductor (CMOS) image sensor (CIS)

Certain types of image sensors utilize photodiodes to capture incident light and convert the light to an electric charge capable of image processing. Examples include Charge Coupled Device (CCD) image sensors and Complimentary Metal Oxide Semiconductor (CMOS) image sensors (CIS), respectively illustrated in FIGS. 1 and 2. The CCD sensor of FIG. 1 is generally configured by an array of photo-detectors that are electrically connected to vertical CCDs functioning as analog shift registers. The vertical CCDs feed a horizontal CCD which in turn drives an output amplifier. In contrast, the CIS device of FIG. 2 is characterized by an array of photo detectors have access devices (e.g., transistors) for connection to word lines and bit lines. The word lines are connected to a row decoder circuit, and the bit lines are connected to a column decoder circuit through column amplifiers. The column amplifiers drive an output amplifier as shown. The configuration of the CIS device is analogous to that of a CMOS memory device.

One drawback with the used of photodiodes relates to their propensity to accumulate electrical charge in the absence of incident light. The result is commonly referred to as "dark current". Dark current from a photodiode may manifest itself as a "white" pixel in the processed image, thus degrading image quality.

Dark current is generally caused by a number of different factors, including plasma damage, stresses, implant damage, wafer defects, electric fields, and so on. However, one particularly major source of dark current is dangling silicon bonds which exist on the surface of the silicon substrate of the image sensor. At relatively high thermal ranges, these dangling silicon bonds generate negative charges that can be accumulated by the photodiode even in the absence of incident light. Such high thermal ranges can occur, for example, when a cell phone having an image sensor is utilized for an extended period of time.

There is a general demand in the industry for image sensors which exhibit reduced dark current, such as the dark current caused by dangling silicon bonds on a silicon substrate surface.

SUMMARY OF THE INVENTION

According to one aspect of the present invention, an image sensor is provided which includes a substrate, a photodiode region located in said substrate, a hole accumulated device (HAD) region located at a surface of the substrate and over said photodiode region, a transfer gate located over the surface of said substrate adjacent said HAD region, a first channel region located in the substrate and aligned below the transfer gate, a second channel region located in the substrate between the transfer gate and the first channel region, and a floating diffusion region which is located in the substrate and which electrically contacts said second channel region.

According to another aspect of the present invention, an image sensor is provided which includes an active pixel array and a CMOS control circuit connected to the active pixel array. The active pixel array includes a matrix of pixels, and each of the pixels includes a substrate, a photodiode region located in the substrate, a hole accumulated device (HAD) region located at a surface of the substrate and over the photodiode region, a transfer gate located over the surface of the substrate adjacent the HAD region, a first channel region located in the substrate and aligned below the transfer gate, a second channel region located in the substrate between the transfer gate and the first channel region, and a floating diffusion region which is located in the substrate and which electrically contacts the second channel region.

According to still another aspect of the present invention, an image sensor is provided which includes a substrate, a photodiode region located in the substrate, a hole accumulated device (HAD) region located at a surface of the substrate and over the photodiode region, a transfer gate located over the surface of the substrate adjacent the HAD region, a first channel region located in the substrate and below the transfer gate, a second channel region located at the surface of the substrate between the transfer gate and the first channel region, and a buried channel charge coupled device (BCCD) region located in the substrate, where the BCCD region electrically contacts the second channel region.

According to yet another aspect of the present invention, an image sensor circuit is provided which includes a plurality of pixels which are operatively connected to charge coupled devices (CCDs). Each of pixels includes a substrate, a photodiode region located in the substrate, a hole accumulated device (HAD) region located at a surface of the substrate and over the photodiode region, a transfer gate located over the surface of the substrate adjacent the HAD region, a first channel region located in the substrate and below the transfer gate, a second channel region located at the surface of the substrate between the transfer gate and the first channel region, and a buried channel charge coupled device (BCCD) region located in the substrate, where the BCCD region electrically contacts the second channel region.

According to another aspect of the present invention, a method of manufacturing an image sensor is provided which includes implanting impurities in a substrate to define a first channel region which extends to a first depth from the substrate surface, implanting impurities in the substrate surface to define a second channel region which is located over the first channel region and extends to a second depth from the substrate surface, forming a transfer gate electrode over the substrate surface and over the first and second channel regions, implanting impurities in the substrate to define a hole accumulated device (HAD) region which extends to a third depth from the substrate surface and which is adjacent the gate electrode, implanting impurities in the substrate to define a photodiode region which is buried in the substrate and extends to a fourth depth from substrate surface, and implanting impurities in the substrate to define a diffusion region which electrically contacts the second channel region, where the HAD region is located over the photodiode region.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

The present invention will now be described by way of several preferred but non-limiting embodiments.

An image sensor according to a first embodiment of the present invention will be described with reference to FIGS. 3-7.

Figure 3:
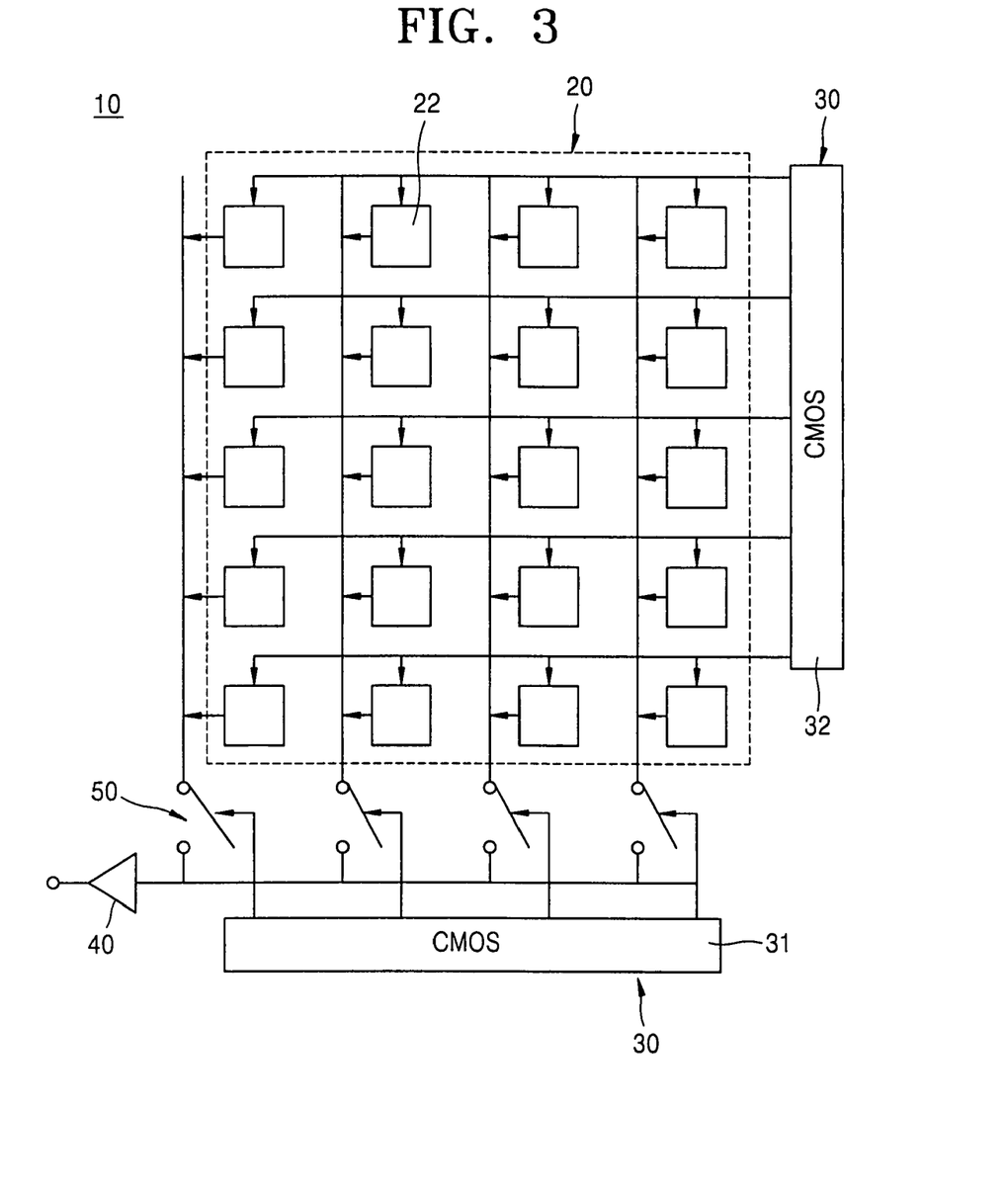
FIG. 3 is a schematic block diagram of a CIS device of an embodiment of the present invention.

FIG. 3 illustrates an example in which an embodiment of the present invention is configured as a CMOS image sensor (CIS) 10. The CIS 10 generally includes an active pixel array 20 and CMOS control circuitry 30. As is schematically shown in FIG. 3, the pixel array 20 includes a plurality of active pixels 22 generally arranged in matrix form. Word lines are respectively connected to the pixels 22 of each row of the pixel array 20, and bit lines are respectively connected to the pixels 22 of each column of the pixel array 20. The CMOS circuitry 30 includes a row decoder 32 for selecting rows (word lines) of the pixel array 20, and a column decoder 31 for selecting columns (bit lines) of the pixel array 20. Selected bit lines are connected to an output amplifier 40 via switching elements 50 controlled by the CMOS circuitry 30.

Figure 4:
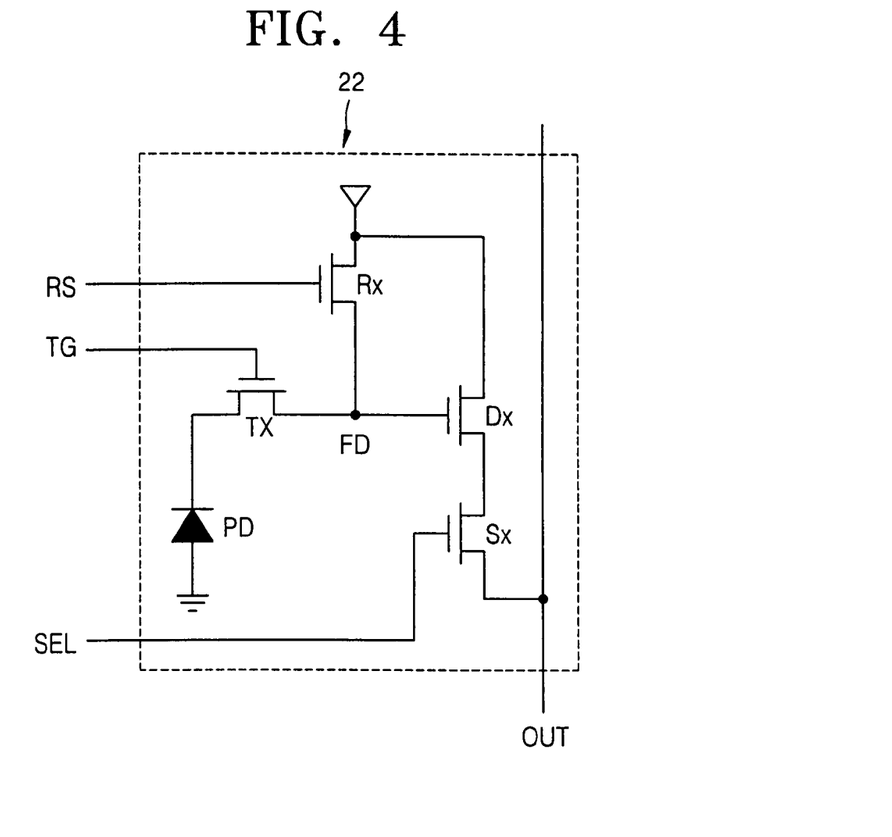
FIG. 4 is an equivalent circuit diagram of a photo-detector element of the CIS device of FIG. 3.

An equivalent circuit diagram of an example of an active pixel 22 is shown in FIG. 4. A photodiode PD of the active pixel 22 captures incident light and converts the captured light into an electric charge. The electric charge is selectively transferred from the photodiode PD to a floating diffusion region FD via a transfer transistor Tx. The transfer transistor Tx is controlled by a transfer gate TG signal. The floating diffusion region FD is connected to the gate of a driver transistor Dx which functions as is a source follower (amplifier) for buffering an output voltage. The output voltage is selectively transferred to an output line OUT by a select transistor Sx. The select transistor Sx is controlled by a select signal SEL. A reset transistor Rx is controlled by a reset signal RS and resets charges accumulated in the floating diffusion region FD to a reference level.

Figure 5:
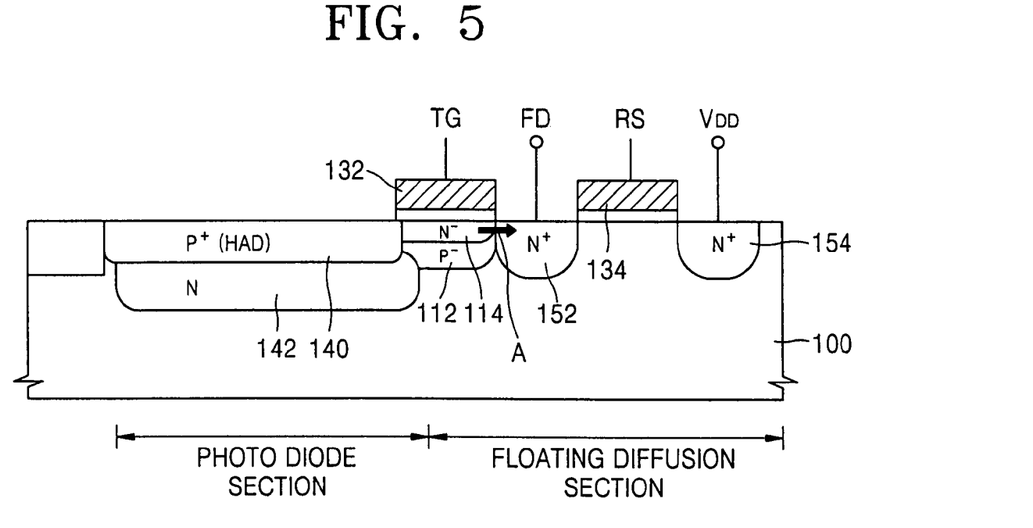
FIG. 5 is a schematic cross-sectional view of a portion of the photo-detector element of FIG. 4.

FIG. 5 is a cross-sectional schematic view of an embodiment of the photodiode PD, transfer transistor Tx and reset transistor Rx illustrated in FIG. 4. For purposes of explanation, the photodiode PD is contained in a photo diode section of a P type substrate region 100, the reset transistor Rx is contained in a floating diffusion section of the P type substrate region 100, and the transfer transistor Tx is connected therebetween.

Referring to FIG. 5, the photodiode (PD) of this example is configured by an N type PD region 142 located in the surface of the photo diode section of the substrate region 100. Negative charges accumulate in the PD region 142 when light is incident on the surface of the substrate region 100.

To reduce the presence of dangling silicon bonds on the surface of the substrate region 100, a P+ type hole accumulated device (HAD) region 140 is interposed between the surface of the substrate region 100 and the PD region 142. The HAD region 140 causes a recombination of negative charges at the surface region of the substrate region 100 located over the PD region 142, thus avoiding the accumulation of such charges in the PD region 142.

The floating diffusion section of the substrate 100 includes an N+ type floating diffusion region 152, an N+ type drain region 154, and a gate 134 extending there between. In this example, the gate 134 receives the reset signal RS, the drain region 154 is connected to VDD, and the floating diffusion region 152 is connected to the floating node FD illustrated in FIG. 4. The drain region 154, the floating diffusion region 152, and the gate 134 define the reset transistor Rx of FIG. 4.

Still referring to FIG. 5, a transfer gate 132 is located over the surface of the substrate region 100 between the HAD region 140 and the floating diffusion region 152. Further, a first P− type channel region 112 is located in the substrate region 100 and aligned below the transfer gate 132, and a second N− type channel region 114 is located in the substrate region 100 between the transfer gate 132 and the first channel region 112. The floating diffusion region 152 electrically contacts the second channel region 114 as depicted by the arrow A of FIG. 5.

In the example of this embodiment, the floating diffusion region 152 has an impurity concentration which is greater than the impurity concentration of the second channel region 114, the first channel region 112 has an impurity concentration which is greater than an impurity concentration of the substrate region 100, and the HAD region 140 has an impurity concentration which is greater than the impurity concentration of the substrate 100. Also, in this example, first channel region 112 contacts both the HAD region 140 and the PD region 142, thereby isolating the second channel region 114 from the PD region 142 by the HAD region 140.

Further, in the example of this embodiment, an implantation depth of the second channel region 114 is less than an implantation depth of the floating diffusion region 152 and less than an implantation depth the HAD region 140. Also, in this example, the implantation depth of the first channel region 112 is less than an implantation depth of the PD region 142 and less than an implantation depth of the floating diffusion region 152.

Still further, in the example of this embodiment, the transfer gate 132 partially overlaps the PD region 142 and the HAD region 140, where the degree of overlap the HAD region 140 is less than the degree of overlap of the PD region 142.

Figure 6:
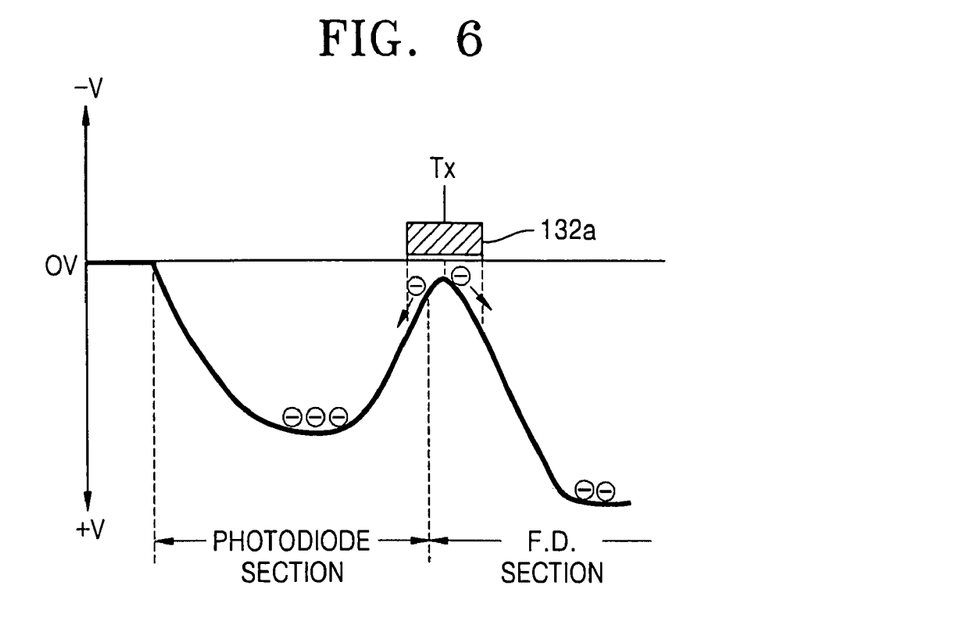
FIG. 6 is a graphical view for explaining the accumulation of charges in a photodiode region of a CIS device not having a second channel configuration.
Figure 7:
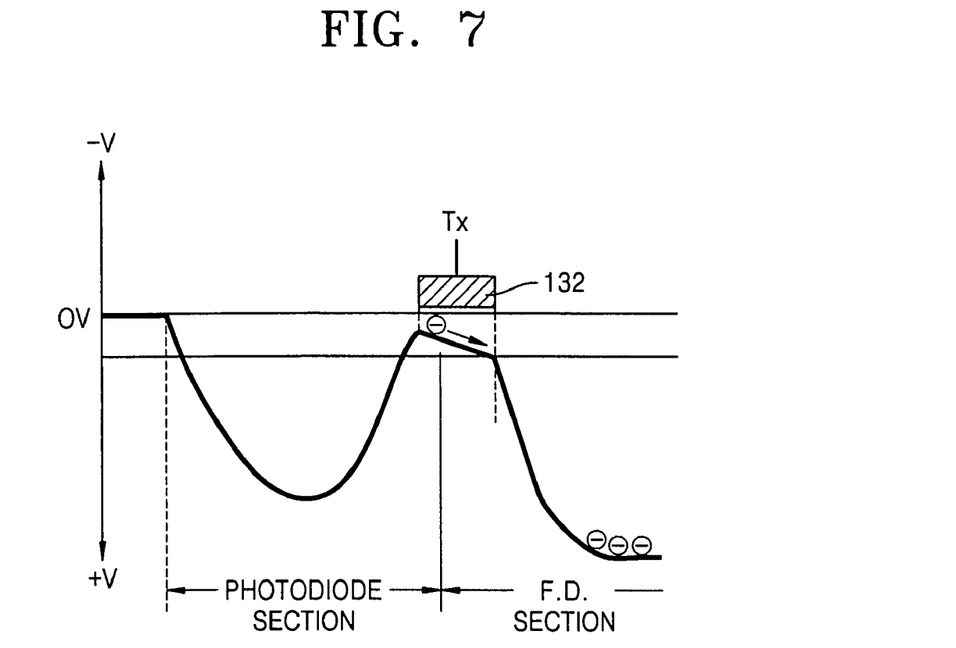
FIG. 7 is a graphical view for explaining the lack of accumulation of charges in a photodiode region of CIS device having a second channel configuration according to an embodiment of the present invention.

FIGS. 6 and 7 are potential distribution diagrams for explaining the effects of the second channel region 114 of FIG. 5. In particular, FIG. 6 shows the potential distribution in the case where no second channel region 114 is provided (i.e., only the first channel region 112 is provided), and FIG. 7 shows the potential distribution where both the first and second channel regions 112 and 114 are provided (i.e., as in FIG. 5).

As described previously, the presence of the HAD region 140 functions to prevent the presence of dangling silicon bonds on the substrate surface from introducing charges into the PD region 142, thus reducing dark current. However, charges may still result from dangling silicon bonds which are present at the substrate surface beneath the gate electrode 132, and these charges can accumulate in the PD region to cause dark current. The present embodiment overcomes this problem by including the second channel region between the substrate surface and the first channel region.

That is, as can be seen from a comparison of FIGS. 6 and 7, the provisioning of the second channel region 114 alters the potential distribution below the gate electrode of the transmission transistor. More precisely, by electrically coupling the N+ type floating diffusion region to the N type second channel region, the potential distribution continuously increases beneath the gate electrode in a direction towards the floating diffusion region. As such, electrons which form at the substrate surface (for example, from silicon dangling bonds) beneath the gate electrode will drift to the floating diffusion region, and not to the PD region 142. Charges are therefore not accumulated in the PD region 142, thus reducing dark current.

In contrast, as illustrated in FIG. 6, when the second channel region 114 is not provided, the potential distribution increases in a direction towards the PD region from a middle region beneath the gate electrode. As such, electrons which form at the surface beneath the gate electrode will drift into the PD region, thus increasing dark current.

Figure 8:
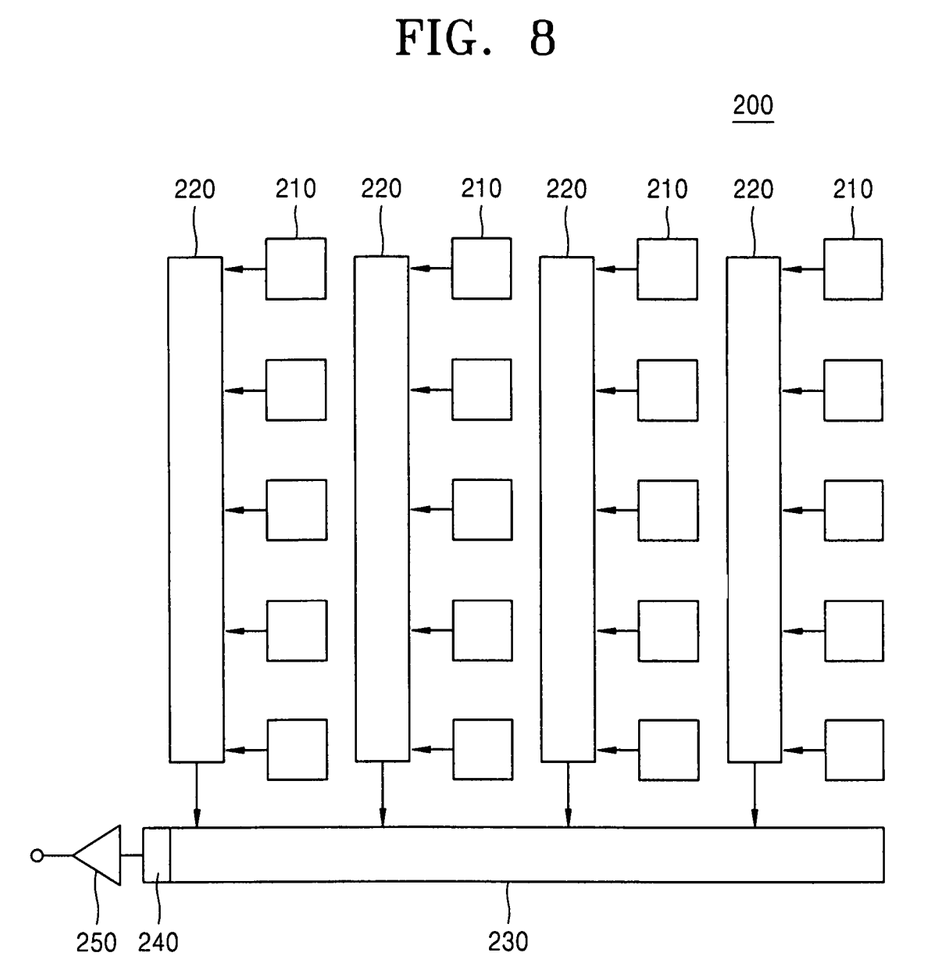
FIG. 8 is a schematic block diagram of a CCD image sensor of an embodiment of the present invention.

FIG. 8 illustrates an example in which an embodiment of the present invention is configured as a CCD image sensor 200. The CCD image sensor 200 generally includes a plurality of pixels 210 each having a photodiode and a transfer gate, a vertical CCD 220, horizontal CCD 230, and floating diffusion region 240, and a source follower (amplifier) 250.

Figure 9:
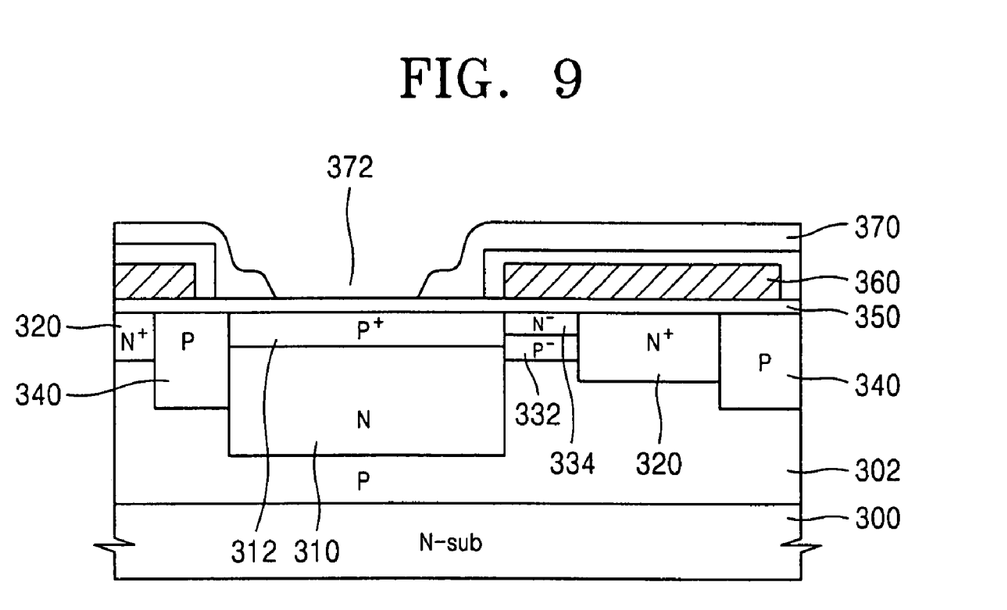
FIG. 9 is a schematic cross-sectional view of a portion of a photo-detector element of the CCD image sensor FIG. 8.

FIG. 9 is a cross-sectional schematic view of an embodiment of the photodiode region and transfer transistor of a pixel 210 illustrated in FIG. 8.

Referring to FIG. 9, the photodiode of this example is configured by an N type photodiode region 310 located in a P type layer 302 formed over an N type semiconductor substrate 300. Negative charges accumulate in the photodiode region 310 when light is incident through an opening 372 of a light shielding layer 370. Reference number 340 denotes P type isolation regions.

To reduce the presence of dangling silicon bonds on the surface of the P type layer 302, a P+ type hole accumulated device (HAD) region 312 is interposed between the surface of the P type layer 302 and the N type photodiode region 310. The HAD region 312 causes a recombination of negative charges at the surface region of the P type layer 302, thus avoiding the accumulation of such charges in the N type photodiode region 310.

Still referring to FIG. 9, a transfer gate 360 is located over the surface of the P type layer 302 between the HAD region 312 and an N+ type buried channel CCD (BCCD) 320. Further, a first P− type channel region 332 is located in the P type layer 302 and below the transfer gate 360, and a second N− type channel region 334 is located in the P type layer 302 between the transfer gate 360 and the first channel region 332. The BCCD 320 electrically contacts the second channel region 334.

In the example of this embodiment, the BCCD 320 has an impurity concentration which is greater than the impurity concentration of the second channel region 334, the first channel region 332 has an impurity concentration which is greater than an impurity concentration of the P type layer 302, and the HAD region 312 has an impurity concentration which is greater than the impurity concentration of the P type layer 302. Also, in this example, the first channel region 332 contacts both the HAD region 312 and the photodiode region 310, thereby isolating the second channel region 334 from the photodiode region 310.

Further, in the example of this embodiment, an implantation depth of the second channel region 334 is less than an implantation depth of the BCCD 320 and less than an implantation depth the HAD region 312. Also, in this example, the implantation depth of the first channel region 332 is less than an implantation depth of the photodiode region 310 and less than an implantation depth of the BCCD 320.

Still further, although not shown in FIG. 9, the transfer gate 360 may partially overlap the photodiode region 310 and the HAD region 312, and the degree of overlap of the HAD region 312 may be less than the degree of overlap of the photodiode region 310 in a manner such as that shown in the device of FIG. 5.

Figure 10:
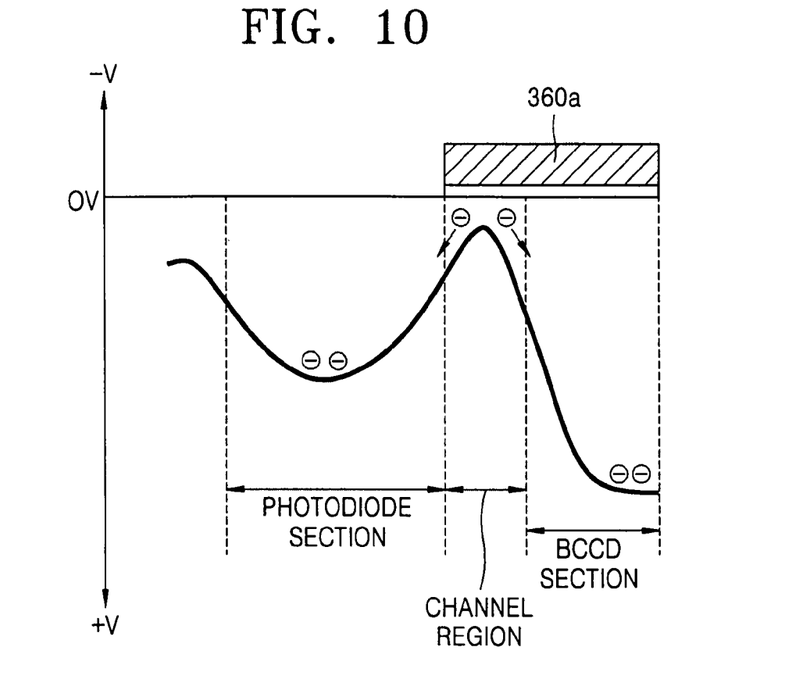
FIG. 10 is a graphical view for explaining the accumulation of charges in a photodiode region of a CCD image sensor not having a two-channel configuration.
Figure 11:
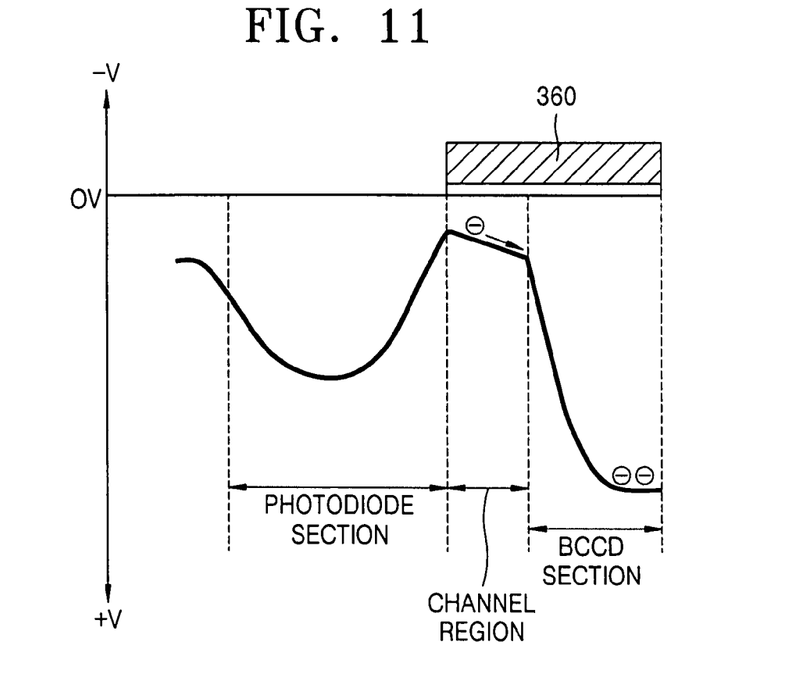
FIG. 11 is a graphical view for explaining the lack of accumulation of charges in a photodiode region of a CCD image sensor having a two-channel configuration according to an embodiment of the present invention.

FIGS. 10 and 11 are potential distribution diagrams for explaining the effects of the second channel region 334 of FIG. 9. In particular, FIG. 10 shows the potential distribution in the case where no second channel region 334 is provided (i.e., only the first channel region 332 is provided), and FIG. 11 shows the potential distribution where both the first and second channel regions 332 and 334 are provided (i.e., as in FIG. 9).

As can be seen from a comparison of FIGS. 10 and 11, the provisioning of the second channel region 334 alters the potential distribution below the gate electrode of the transmission transistor. More precisely, by electrically coupling the N+ type BCCD to the N type second channel region, the potential distribution continuously increases beneath the gate electrode in a direction towards the floating diffusion region. As such, electrons which form at the substrate surface (for example, from silicon dangling bonds) beneath the gate electrode will drift to the floating diffusion region, and not into the N type the photodiode region. Charges are therefore not accumulated in the photodiode region, thus reducing dark current.

In contrast, as illustrated in FIG. 10, when the second channel region 114 is not provided, the potential distribution increases in a direction towards the photodiode region from a middle region beneath the gate electrode. As such, electrons which form at the surface beneath the gate electrode will drift into the photodiode region, thus increasing dark current.

An exemplary method of manufacturing the device illustrated in FIG. 5 will now be described with reference to FIGS. 12A through 12G.

Figure 12A:
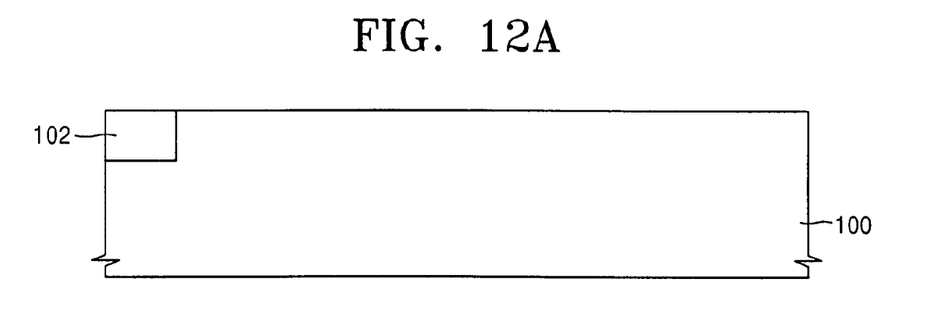
FIGS. 12(A) through 12(G) are schematic cross-sectional views for explaining a method of manufacturing a CIS device according to an embodiment of the present invention.

Initially, as shown in FIG. 12A, a LOCOS or STI region 102 is formed in a semiconductor substrate 100 to define an active area of the substrate 100.

Figure 12B:
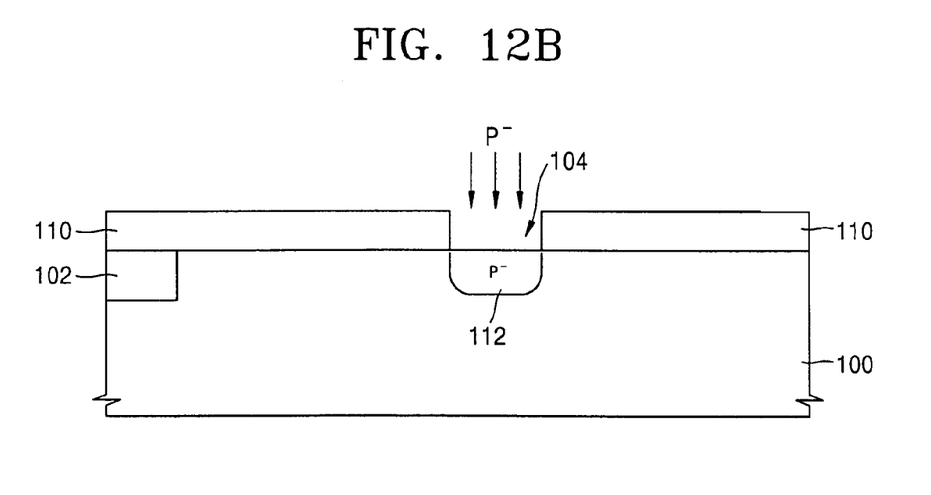

Then, as shown in FIG. 12B, a mask layer 110 is patterned over the surface of the substrate 100 with an opening which defines a transistor region 104. P type impurities are then implanted through the opening to define a P− type channel region 112. In this example, boron is implanted at 30 KeV to obtain an impurity concentration of about $1*10^{12}/cm^2$.

Figure 12C:
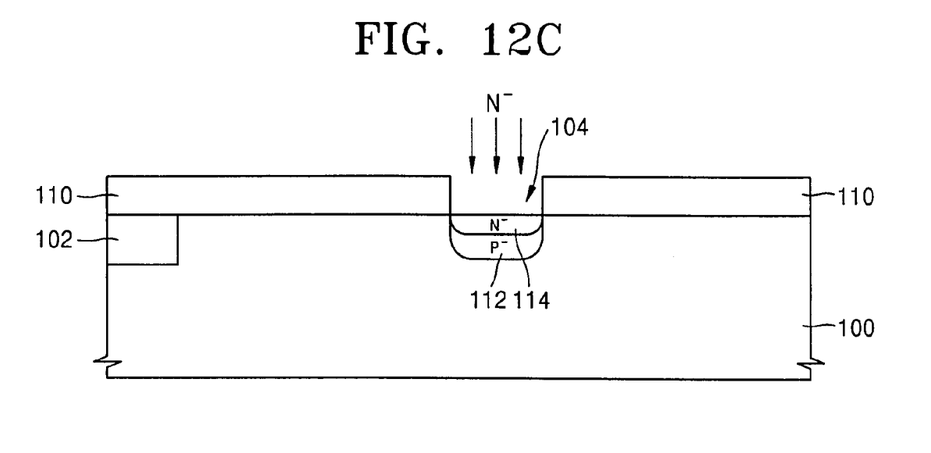

As illustrated in FIG. 12C, an N− type channel region 114 is then formed by implantation of N type impurities through the opening in the mask layer 110. In this example, arsenic is implanted at 30 KeV to obtain an impurity concentration of about $5*10^{12}/cm^2$. As shown, the resultant is two channel regions 112 and 114, where the N− type channel region 114 is located between the P− type channel region 112 and the opening in the mask layer 110.

Figure 12D:
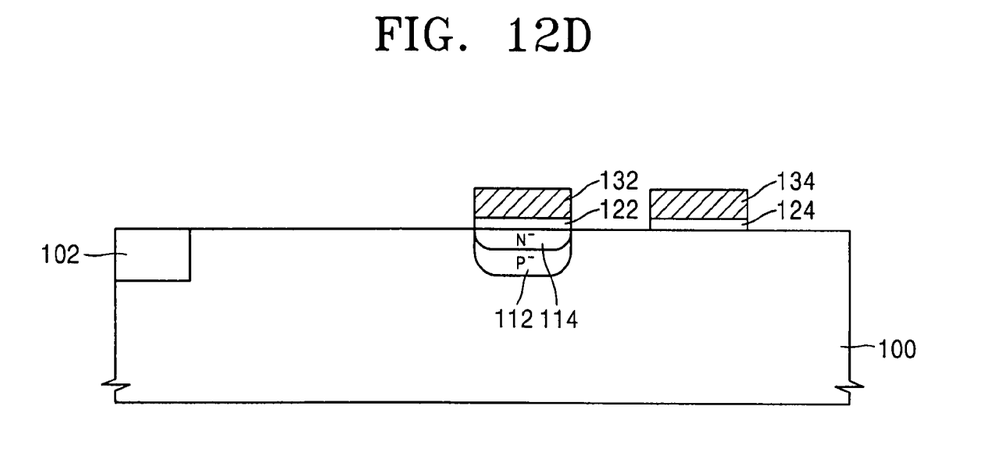

Referring to FIG. 12D, an insulating layer and conductive layer are deposited and patterned to define gate structures over the active region of the substrate 100. In particular, a first gate structure is aligned over the channel regions 112 and 114, and is defined by a gate insulating layer 122 and a gate electrode 132. A second gate structure is spaced from the first gate structure, and is defined by a gate insulating layer 124 and a gate electrode 134.

Figure 12E:
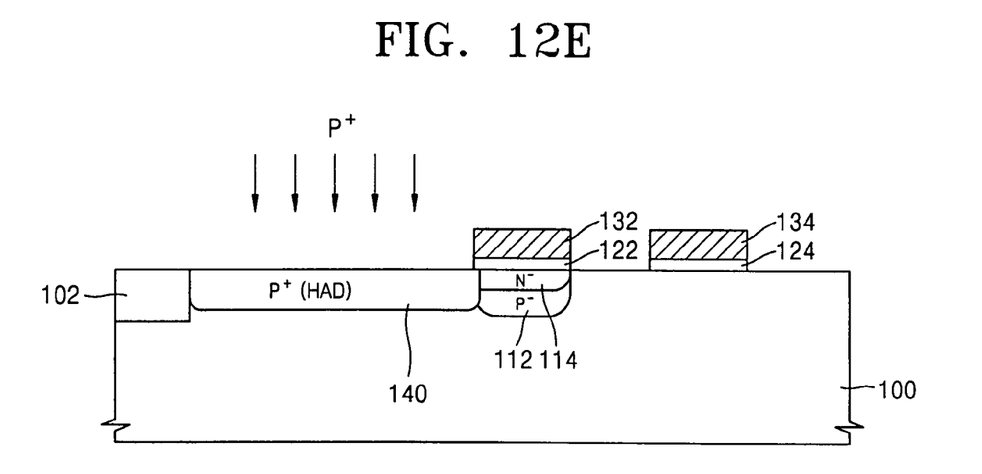

Next, as illustrated in FIG. 12E, a P+ type HAD region 140 is formed by implanting P type ions through an opening in a mask (not shown), where the opening is aligned over a photodiode region of the device. In this example, $BF_2$ is implanted at 50 KeV to obtain an impurity concentration of about $5*10^{13}/cm^2$.

Figure 12F:
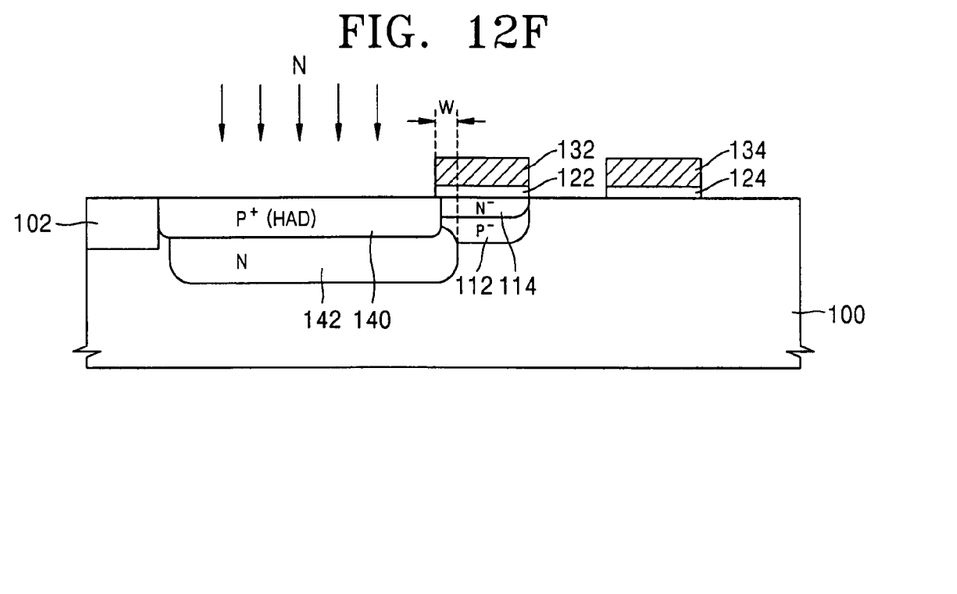

The N type photodiode region 142 is then formed, as shown in FIG. 12F, by implantation of N type impurities through an opening in a mask layer. In this example, arsenic is implanted at 400 KeV to obtain an impurity concentration of about $1.7*10^{12}/cm^2$. Here, the mask layer may optionally be the same as that used to form the HAD region 140. Also, as shown by reference character W of FIG. 12F, the gate electrode 132 may optionally overlap the photodiode region 142.

Figure 12G:
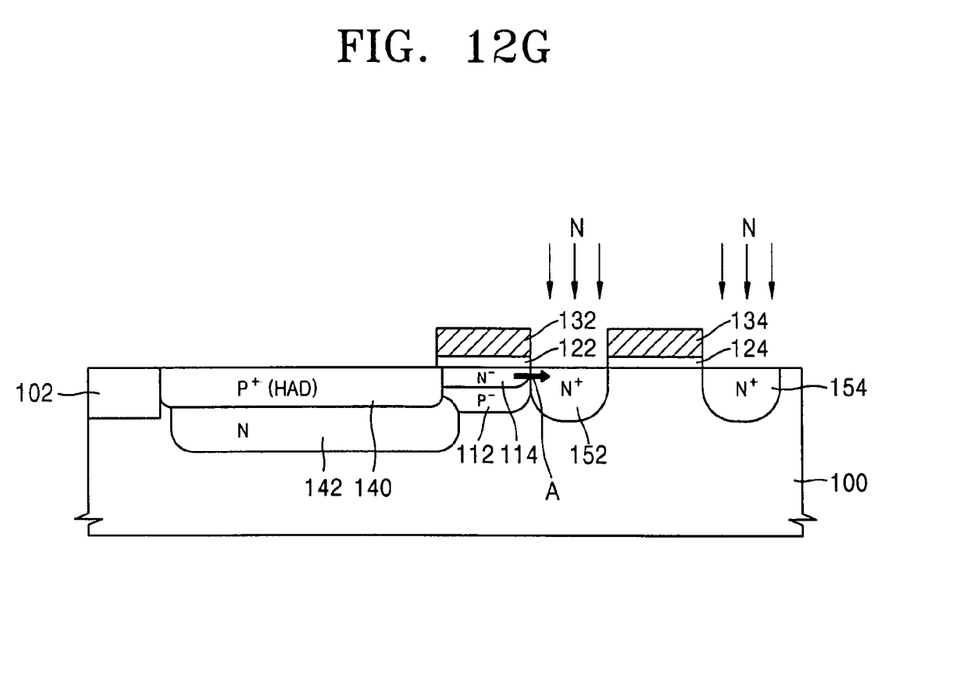

Referring lastly to FIG. 12G, the N+ type floating diffusion region 152 and the N+ type drain region 154 are then formed by implantation of N type impurities.

In each of the embodiments described above, the photodiode region, the second channel region, and the floating diffusion region (or CCD region) are all defined by N type impurities, and the first channel region and substrate (or layer) are defined by P type impurities. However, the invention may also be configured such that the photodiode region, the second channel region, and the floating diffusion region (or CCD region) are defined by P type impurities, and the first channel region and substrate (or layer) are defined by N type impurities.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A method of manufacturing an image sensor, comprising:
    implanting impurities of a first conductivity type in a substrate of the first conductivity type to define a first channel region which extends to a first depth from a surface of the substrate;
    implanting impurities of a second conductivity type in the substrate surface to define a second channel region which is located over the first channel region and extends to a second depth from the substrate surface, wherein the first depth is greater than the second depth;
    forming a transfer gate electrode over the substrate surface and over the first and second channel regions;
    implanting impurities of the first conductivity type in the substrate to define a hole accumulated device (HAD) region which extends to a third depth from the substrate surface and which is adjacent the gate electrode;
    implanting impurities of the second conductivity type in the substrate to define a photodiode region which is buried in the substrate and extends to a fourth depth from substrate surface, wherein the fourth depth is greater than the third depth;
    implanting impurities of the second conductivity type in the substrate to define a diffusion region which electrically contacts the second channel region,
    wherein the HAD region is located over the photodiode region, and wherein the impurities of the HAD region are implanted prior to the impurities of the photodiode region.

2. The method of claim 1, wherein said diffusion region has a higher impurity concentration than said second channel region.

3. The method of claim 1, wherein the image sensor is a CMOS image sensor, and wherein diffusion region is a floating diffusion region of the CMOS image sensor.

4. A method of manufacturing an image sensor, comprising:
    implanting impurities of a first conductivity type in a substrate of the first conductivity type to define a first channel region which extends to a first depth from a surface of the substrate;
    implanting impurities of a second conductivity type in the substrate surface to define a second channel region which is located over the first channel region and extends to a second depth from the substrate wherein the first depth is greater than the second depth;
    forming a transfer gate electrode over the substrate surface and over the first and second channel regions;
    implanting impurities of the first conductivity type in the substrate to define a hole accumulated device (HAD) region which extends to a third depth from the substrate surface and which is adjacent the gate electrode;
    implanting impurities of the second conductivity type in the substrate to define a photodiode region which is buried in the substrate and extends to a fourth depth from substarte surface, wherein the fourth depth is greater than the third depth;
    implanting impurities of the second conductivity type in the substrate to define a diffusion region which electrically contacts the second channel region,
    wherein the HAD region is located over the photodiode region, and
    wherein the image sensor is a CCD image sensor, and wherein the diffusion region is a buried channel charge coupled device (BCCD) region of the CCD image sensor.

5. The method of claim 1, wherein the first conductivity type is a P conductivity type and the second conductivity type is an N conductivity type.

6. The method of claim 1, wherein the first conductivity type is N conductivity type and the second conductivity type is a P conductivity type.

* * * * *